United States Patent [19]

Stewart et al.

[11] Patent Number: 4,933,904
[45] Date of Patent: Jun. 12, 1990

[54] DENSE EPROM HAVING SERIALLY COUPLED FLOATING GATE TRANSISTORS

[75] Inventors: Roger G. Stewart, Hillsborough Township, Somerset County; Alfred C. Ipri, Hopewell Township, Mercer County; Louis S. Napoli, Hamilton Township, Mercer County, all of N.J.

[73] Assignee: General Electric Company, Schenectady, N.Y.

[21] Appl. No.: 134,585

[22] Filed: Dec. 14, 1987

Related U.S. Application Data

[63] Continuation of Ser. No. 803,004, Nov. 29, 1985, abandoned.

[51] Int. Cl.[5] .............................................. G11C 7/00
[52] U.S. Cl. .................................... 365/195; 365/185; 365/204; 357/23.5
[58] Field of Search ................ 365/94, 103, 104, 129, 365/184, 185, 195, 203, 204; 307/469, 465, 200 R, 468, 440; 357/23.5, 23.1, 7; 340/825.79, 825.83, 825.85, 825.86, 825.87, 825.89, 825.91, 825.9; 364/716, 715

[56] References Cited

U.S. PATENT DOCUMENTS

| 4,099,196 | 7/1978 | Simko | 365/185 |
|---|---|---|---|
| 4,150,389 | 4/1979 | Roessler | 357/23 |
| 4,185,319 | 1/1980 | Stewart | 365/185 |
| 4,442,447 | 4/1984 | Ipri et al. | 357/41 |
| 4,467,453 | 8/1984 | Chiu et al. | 365/185 |
| 4,495,427 | 1/1985 | Cartwright, Jr. | 307/469 |
| 4,500,975 | 2/1985 | Shirato | 365/104 |
| 4,580,247 | 4/1986 | Adam | 365/185 |

FOREIGN PATENT DOCUMENTS

| 0182162 | 9/1985 | Japan | 365/185 |
|---|---|---|---|
| 84/02800 | 7/1984 | World Int. Prop. O. | 365/104 |

OTHER PUBLICATIONS

Yaron et al., "16K E²PROM With New Array Architecture", Electronic Engineering, vol. 54, No. 666, Jun. 1982, pp. 35–47.

*Primary Examiner*—Glenn A. Gossage
*Attorney, Agent, or Firm*—Henry I. Steckler; James C. Davis, Jr.; Paul R. Webb, II

[57] ABSTRACT

A compact memory has a plurality of memory cells that are serially coupled. The plurality of cells are capacitively coupled to a substrate and directly coupled to switching circuits at both of its ends, which can disconnect the plurality of cells from a bit line at one end and a ground bus at the other end. An inhibit operation comprises precharging an array of pluralities of cells and the discharging of a selected plurality of cells. A WRITE operation comprises turning ON non-selected cells and then applying a programming voltage to a selected cell.

3 Claims, 3 Drawing Sheets

DENSE EPROM HAVING SERIALLY COUPLED FLOATING GATE TRANSISTORS

This is a continuation of Ser. No. 803,004, filed 11/29/85, now abandoned.

BACKGROUND OF THE INVENTION

The present invention relates to an eraseable programmable read only memory (EPROM), and more particularly to one that is designed to have a high density of memory cells.

In a typical EPROM, each cell has its own structures for controlling READ and WRITE operations. In particular, switching means, such as ground isolation transistors and transistors for applying voltages, are present at each cell. This increases the required cell area since more than one transistor per cell is required.

SUMMARY OF THE INVENTION

In accordance with several aspects of the invention, a memory comprises a plurality of transistor memory cells which are serially coupled to form a stack. The stack is capacitively coupled to a substrate and directly coupled to switching means at both ends of the stack which are provided for floating the stack.

Programming is achieved with a sequence of operations including a precharge, selective discharge, and write. In particular, a DYNAMIC INHIBIT operation includes precharging an array of stacks followed by the discharging of a selected stack. A WRITE operation of a selected transistor memory cell is then accomplished by turning ON non-selected cells within the selected stack and then applying a programming voltage to said selected cell.

All of these aspects permit sharing of common structures for controlling READ and WRITE operations, thus reducing the memory area.

DETAILED DESCRIPTION

Figure 1:
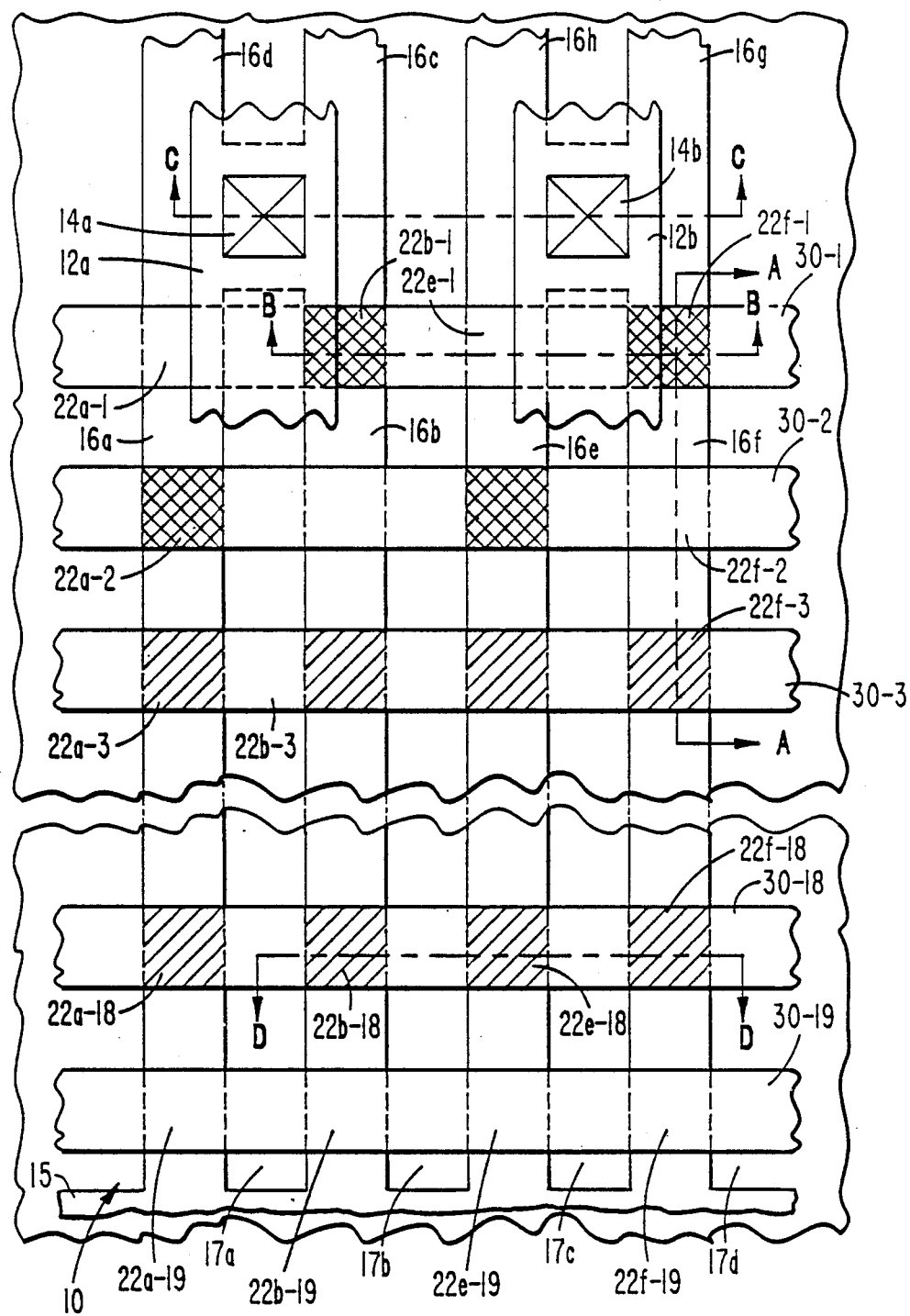
FIG. 1 is a top view of an EPROM.

FIG. 1 shows an EPROM 10 comprising conductive bit lines 12a and 12b, that extend from beneath the bottom of the figure to beyond the top thereof, only broken away portions being shown for the sake of clarity. The bit lines 12a and 12b are connected to conductive contacts 14a and 14b, respectively, (see also FIG. 2C). The contact 14a is connected to four active areas or memory stacks 16a, 16b, 16c, and 16d, while the contact 14b is connected to another four active areas 16e, 16f, 16g, and 16h in a substrate 18. All active areas 16 are coupled to a reference voltage, such as ground, at their ends remote from contact 14 by way of a ground bus 15.

Since each of the bit lines 12a and 12b is connected to four stacks or active areas 16, minimum design rules (maximum density) can be used for the active area pitch, e.g. about 2 micrometers ($\mu$m), while relaxed rules (non-maxium density) can be used for the conductive bit lines 12, e.g. 4 $\mu$m pitch, resulting in a higher yield.

The active areas 16 are isolated from each other by continuous field insulating regions (FIR) 17. In particular, FIR 17a isolates active regions 16a and 16b, FIR 17b isolates active regions 16b and 16e (as well as the regions 16c and 16h), FIR 17c isolates active regions 16e and 16f, and FIR 17d isolates active region 16f from an adjacent one (not shown). Field implant regions (not shown) are beneath the field insulating regions 17, as known in the art.

Figure 2A:
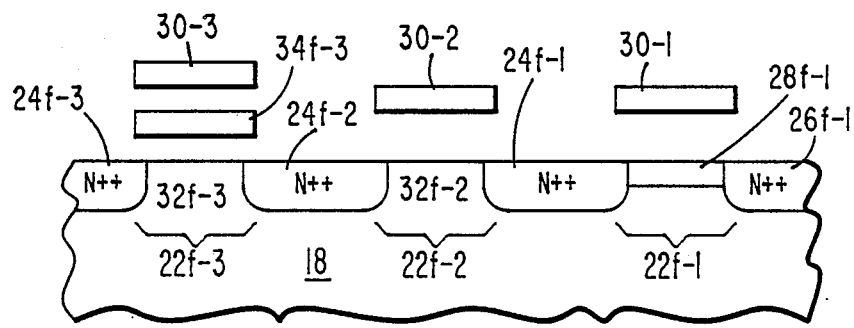
FIGS. 2A, 2B, 2C, and 2D show cross-sections taken along lines A—A, B—B, C—C, and D—D, respectively, of FIG. 1.

The active area 16f will now be considered in detail in conjunction with FIG. 2A, wherein insulating regions have been omitted for clarity. The field effect transistor (FET) 22f-1 comprises source and drain regions 24f-1 and 26f-1, respectively, which are disposed in the substrate 18, with a shorted channel region 28f-1 therebetween. Thus the transistor 22f-1 is always ON (conducting). The transistor 22f-1, as well as other transistors with shorted channel regions (described below), are indicated in FIG. 1 by doubly hatched areas. Above the channel region 28f-1 is a control gate or word stack line 30-1 that also extends across the active areas 16a, 16b and 16e.

A switching means or transistor 22f-2 lies adjacent the transistor 22f-1 and comprises a source region 24f-2 with the region 24f-1 comprising the drain region thereof. A control gate or word stack line 30-2 overlies the conventional (not shorted) channel region 32f-2 between the regions 24f-2 and 24f-1.

A transistor 22f-3 lies adjacent the transistor 22f-2 and comprises a source region 24f-3 with the region 24f-2 comprising the drain region thereof. Above the conventional channel region 32f-3 is a floating gate 34f-3. This floating gate, as well as the other floating gates (described below), are shown as singly hatched areas in FIG. 1. A control gate or word bit line 30-3 lies above the floating gate 34f-3.

Figure 2B:
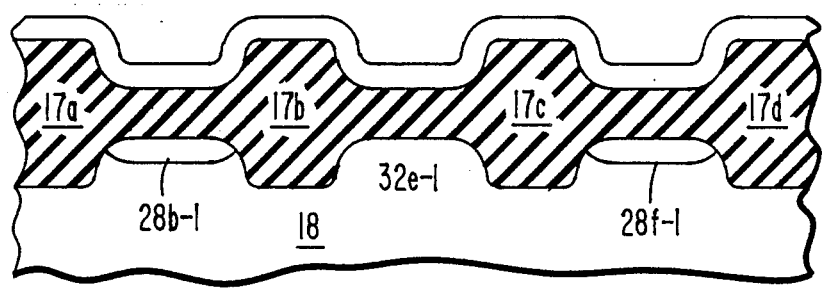
Figure 2C:
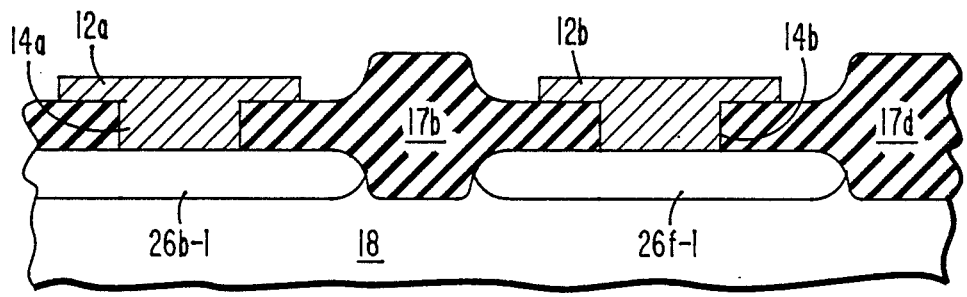
Figure 2D:
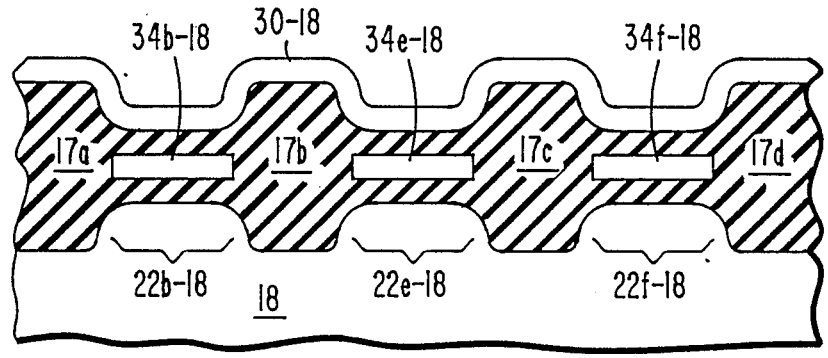

The transistor 22f-3 is the first memory cell in the active area 16f. By way of illustration there are a total of sixteen such identical memory cells in each stack or active area 16. For clarity only the first of said cells 22f-3 (described above and the last of said cells 22f-18 are shown in FIG. 1. There must be at least one intermediate memory cell in each column. The transistor 22f-18 is controlled by control gate or word bit line 30-18 (FIG. 2D). A switching means comprises the last transistor 22f-19, which is a conventional, i.e. non-floating gate, ground isolation FET, which is controlled by control or ground isolation gate 30-19. The source (not shown) of transistor 22f-19 is grounded by the bus 15.

The transistors in active area 16e are identical to that in active area 16f (described above) except that the channel region 32e-1 of the transistor 22e-1 (FIG. 2B) is conventional, i.e. it is controlled by the word stack line 30-1, and the transistor 22e-2 is always ON due to a shorted channel region (not shown) thereof. The last memory cell in active area 16e is the transistor 22e-18, while the switching means or ground isolation transistor is the transistor 22e-19. The transistors in active area 16b are identical to that in active area 16f, i.e. the transistor 22b-1 is always ON due to the shorted channel region 28b-1 as shown in FIG. 2B, and the transistor 22b-2 is controlled by the word stack line 30-2. The transistors in active area 16a are identical to those in active area 6e. Thus the transistor 22a-1 is controlled by the word stack line 30-1 and the transistor 22a-2 is always ON due to a shorted channel region (not shown).

Figure 3:
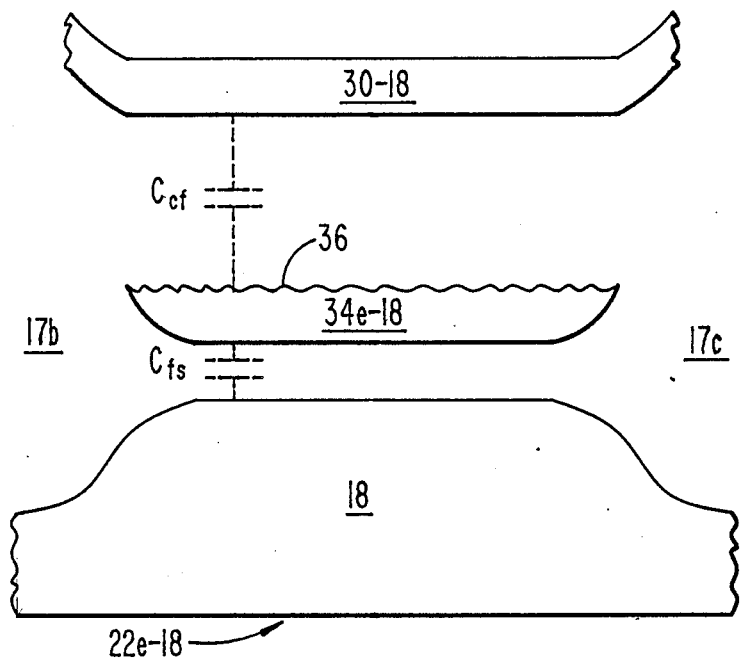
FIG. 3 is an enlarged cross-section of a transistor memory cell of FIG. 2D.

FIG. 3 shows the transistor 22e-18, the other transistors 22 having a floating gate being identical. The floating gate 34e-18 is spaced from the substrate 18 by about 10 nanometers (nm) and has a capacitance with respect to the substrate designated as $C_{fs}$. The field insulating regions 17b and 17c have a positive taper (wider at the bottom of the floating gate 34e-18 than at the top thereof). U.S. Patent Application Ser. No. 768,833, filed Aug. 23, 1985, now abandoned in favor of Ser. No. 933,283, filed Nov. 29, 1986, now abandoned discloses a method for making a transistor having such a taper. The top surface 36 of the floating gate 34e-18 is textured to reduce the barrier height to 1.25 electron volts so that electron tunneling is made easier. The word bit line 30-18 is about 28 nm above the floating gate 34e-18 and is self-aligned therewith in the length (source-to-drain direction) axis. Further, the floating gate 34e-18 is self-aligned with the field insulating regions 17b and 17c, and thus with the channel region of the transistor 22e-18, in the width axis. Due to this alignment in two axes, the transistor 22e-18 occupies a small area and is scalable. U.S. Patent Application Ser. No. 748,447, filed June 25, 1985, now abandoned discloses a method for achieving such an alignment. The capacitance between the word bit line 30-18 and the floating gate 34e-18 is designated $C_{cf}$ and is less than the capacitance $C_{fs}$, preferably much less than $C_{fs}$. In a particular embodiment $C_{fs}$ is about 3 times greater than $C_{cf}$, i.e. about the ratio of the thickness of the insulating layers between the control gate 30-18 and floating gate 34e-18 and between the floating gate 34e-18 and the substrate 18.

A problem with the embodiment of FIG. 3 of the cell 22e-18 is that the distance between the floating gate 34e-18 and the substrate 18 cannot be made so small as to achieve a large value of the ratio $C_{fs}/C_{cf}$ since then tunnelling will occur therebetween. This tunnelling will limit the amount of charge stored on the floating gate 34e-18 during a WRITE operation (described below).

Figure 4:
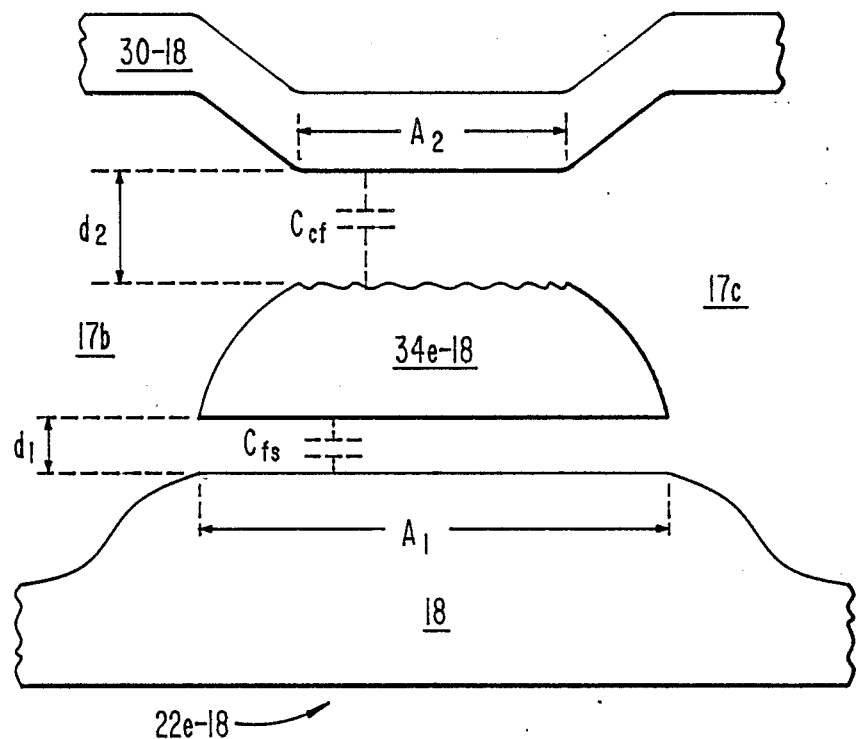
FIG. 4 is a cross-sectional view of an alternate embodiment of the cell of FIG. 3.

FIG. 4 shows an embodiment of the cell 22e-18 that avoids this problem, wherein the floating gate 34e-18 is wider at its bottom than at its top. Thus the effective area A, of the capacitor having the capacitance $C_{fs}$ is larger than the effective area $A_2$ of the capacitor having the capacitance $C_{cf}$. Further the spacing $d_1$ is smaller than the spacing $d_2$. Since capacitance is proportional to the effective area of a capacitor and inversely proportional to the spacing of the capacitor plates, the capacitance $C_{fs}$ is much greater than the capacitance $C_{cf}$. Thus for the embodiment of FIG. 4 $C_{fs}/C_{cf}$ will be desirably greater than the ratio of $d_2/d_1$ as in the embodiment of FIG. 3.

Further, still other embodiments of the cells can be used with the present invention.

The conductive bit lines 12, and the contacts 14 can comprise a good conductor, such as aluminum. The active areas 16, the substrate 18 and the conventional channel regions 32 can comprise a lightly doped semiconductor, such as $P^{31}$ conductivity type silicon. The source and drain regions 24 and 26 and the bus 15 can comprise a very heavily doped semiconductor, such as $N^{++}$ conductivity type silicon. The shorted channel regions 28 can comprise a heavily doped semiconductor, such as $N^{+}$ conductivity type silicon. The field insulating regions 17 can comprise any insulator, such as silicon dioxide. The floating gates 34 and the control gates 30 can comprise a heavily doped semiconductor, such as $N^{+}$ conductivity type polycrystalline silicon (polysilicon) or microcrystalline silicon.

Now the operation of the EPROM 10 will be considered. The first operation is WRITE PRECHARGE. Zero volts is applied to the ground isolation gate line 30-19. This turns OFF the ground isolation transistors 22a-19, 22b-19, 22e-19, and 22f-19. Then 12.5 volts is applied to the bit lines 12, while 15 volts is applied to the word stack lines 30-1 and 30-2, and to the word bit lines 30-3 through 30-18. The channel regions 32 invert to become N-conductivity type and thus all the transistors are ON except for the ground isolation transistors. All the source and drain regions 24 and 26 now charge up about to 12.5 volts with respect to the substrate 18, which is grounded.

The next operation is DECODED DISCHARGE. The ground isolation transistors 22a-19, 22b-19, 22e-19, and 22f-19 are still OFF since zero volts is still applied to the gate line 30-19. If the active area 16e is selected for the ITE operation, then its bit line 12b has zero volts applied to it, and its word stack line 30-1 has 5 volts applied thereto, turning ON the transistor 22e-1. The word bit lines 30-3 through 30-18 are set to 5 volts, thereby turning ON the transistors 22e-3 through 22e-18. Thus all of the charge stored in the source and drain regions 24 and 26 of the transistors 22e-3 through 22e-18 now goes to ground through the bit line 12b. Since the voltage on the word stack line 30-2 has zero volts applied thereto, the transistor 22f-2 is OFF. Thus the transistors 22f-3 through 22f-18 retain their stored charge. The non-selected bit line 12a has 5 volts applied thereto, and thus this voltage is also present at the source regions of the transistors 22a-1 and 22b-2. Since the word stack line 30-1 has 5 volts thereon, the transistor 22a-1 is OFF. Further, since the word stack line 30-2 has zero volts thereon, the transistor 22b-2 is OFF. Thus the transistors 22a-3 through 22a-18 and 22b-3 through 22b-18 retain their stored charge.

The WRITE PRECHARGE and DECODED DISCHARGE operations together comprise a DYNAMIC INHIBIT operation of the EPROM 10.

Thereafter the WRITE operation is performed. All of the ground isolation transistors 22a-19, 22b-19, 22e-19, and 22f-19 are still OFF since zero volts is still applied to the gate line 30-19. If it is desired to WRITE a "1" into the transistor 22e-18 of FIG. 3, then about 15 volts is applied to word bit line 30-18. The remaining word bit lines 30-3 through 30-17 have 5 volts applied thereto as does the word stack line 30-1 and the bit line 12a. The bit line 12b has zero volts applied thereto as does the word stack line 30-2. Thus the transistors 22e-1 and 22e-3 through 22e-17 are ON and the transistor 22f-2 is OFF. Due to the electric field between the substrate 18 and the word bit line 30-18, the floating gate 34e-18 supplies electrons by Fowler-Nordleim tunneling to the word bit line 30-18. The voltage on the floating gate 34e-18 with respect to the substrate 18 increases from about zero volts to about +2 volts, thereby causing a threshold voltage shift of the transistor 22e-18 of about from +1 volt (enhancement mode device) to −7 volts (depletion mode device). The greater the value of $C_{fs}$ as compared to $C_{cf}$, the greater the shift in value of the voltage on the floating gate 34e-18. In order to WRITE a "0", the word bit line 30-18 has 5 volts thereon, which is less than the voltage needed for the occurrence of a tunneling current. Thus the transistor 22e-2 remains an enhancement mode device.

If the charge supplied during DYNAMIC INHIBIT leaks away from the source and drain regions of stacks that are not being written before a full WRITE operation, i.e. fully charging the floating gate, on a particular cell can be performed, then a partial WRITE operation can be performed followed by DYNAMIC INHIBIT. This can be repeated as often as necessary to fully perform WRITE, i.e. fully charge the floating gate. If the charge on the source and drain regions of the non-selected stacks stays for a sufficient time, then several or possibly even all sixteen cells of the selected stack can be serially written without repeating DYNAMIC INHIBIT. Thereafter DYNAMIC INHIBIT followed by WRITE is repeated for the remaining stacks.

The last operation is READ. In order to read the transistor 22e-18, the bit lines 12a and 12b receive a voltage of 2.5 volts. A voltage of 5 volts is applied to the word stack line 30-1, to the word bit lines 30-3 through 30-17, and to the ground isolation gate 30-19. This turns ON the transistors 22e-1, 22e-3 through 22e-17, and 22e-19 regardless of whether they are storing a 0 or a 1. The word bit line 30-18 has a voltage of zero volts applied thereto. If the floating gate 34b-18 has zero volts thereon (storing a 0), then no current flows on the bit line 12b, since the transistor 22e-18 is an enhancement mode transistor which remains OFF. If the floating gate 34e-18 has +2 volts thereon (storing a 1), a current will flow in the active area 16e since the transistor 22e-18 is a depletion mode transistor. This current is sensed by a sense amplifier (not shown) connected to the bit line 12b. Thereafter the READ operation can be performed for the remaining cells of stack 16e. Then the READ operation can be performed for the remaining stacks. Sense amplifiers are respectively coupled to the remaining bit lines 12 for this purpose.

It will be appreciated that the structure and operation of the present invention permits sharing of the switching means, e.g. the transistors 22a-1, 22b-2, 22e-1, and 22f-2, as well as the transistors 22a-19, 22b-19, 22e-19, and 22f-19, over an entire memory stack, e.g. 16a, 16b, 16e, and 16f, respectively. Thus the memory 10 is compact.

The EPROM 10 can be erased using ultraviolet light. If electrical erasure is desired, then the surfaces of the control gates 30 that face the floating gates 34 can be textured.

What is claimed is:

1. A method of operating an electrically programmable memory array including a step of inhibiting the electrical WRITE operation of non-selected columns of series coupled memory cells, each of said columns having a pair of end memory cells and at least one intermediate cell, each of said memory cells including only a single transistor having spaced source and drain regions, a channel region therebetween, and only two gates, said gates respectively being a floating gate overlying and insulated from said channel region, and a control gate overlying and insulated from said floating gate, source and drain regions of said at least one intermediate cell being serially coupled only to drain and source regions, respectively, of other transistor memory cells in a corresponding column at associated intermediate connection points, each of said columns also having an isolation transistor having a source and drain coupled between one of said end cells and a first reference voltage, and a gate; a plurality of bit lines respectively coupled to said columns; said inhibiting step comprising:

isolating source and drain regions of each of said columns of series coupled memory cells from said first reference voltage in response to a selected voltage applied to the gate of the isolation transistor in each of said columns;

thereafter charging source and drain regions of each of said columns of series coupled memory cells to a second reference voltage with respect to a substrate in response to selected voltages applied to respective bit lines and control gates of memory cells in each of said columns of memory cells; and thereafter discharging to said first reference voltage each of the source and drain regions in a selected column of series coupled memory cells in response to selected voltages respectively applied to the bit line of said selected column and control gates of memory cells in said selected column.

2. The method of claim 1, further comprising a step of writing a selected cell in said selected column of series coupled memory cells, said writing step including:

coupling source and drain regions of said selected column of series coupled cells to said first reference voltage;

thereafter turning ON non-selected cells in said selected column of series coupled cells in response to a third reference voltage applied to control gates of said non-selected cells, said third reference voltage having a value between the values of said first and second reference voltages; and thereafter applying a programming voltage to a control gate of said selected cell in said selected column of series coupled cells.

3. The method of claim 2, further comprising repeating the inhibiting and writing steps until said selected cell achieves a selected fully written state.

* * * * *